United States Patent [19]

Telichevesky et al.

[11] Patent Number: 6,151,698

[45] Date of Patent: Nov. 21, 2000

[54] METHOD FOR DETERMINING THE STEADY STATE BEHAVIOR OF A CIRCUIT USING AN ITERATIVE TECHNIQUE

[75] Inventors: Ricardo Telichevesky, San Jose; Kenneth S. Kundert, Los Altos, both of Calif.; Jacob K. White, Belmont, Mass.

[73] Assignee: Cadence Design Systems, Inc., San Jose, Calif.

[21] Appl. No.: 08/847,884

[22] Filed: Apr. 28, 1997

Related U.S. Application Data

[60] Provisional application No. 60/016,781, Apr. 30, 1996.

[51] Int. Cl.⁷ ..................................................... G06F 17/50
[52] U.S. Cl. .................................. 716/1; 703/13; 703/14; 703/22
[58] Field of Search ..................................... 364/488, 489, 364/490, 578; 395/500; 716/1; 703/13, 14, 22

[56] References Cited

U.S. PATENT DOCUMENTS

| | | | |
|---|---|---|---|
| 5,394,322 | 2/1995 | Hansen | 364/148 |
| 5,588,142 | 12/1996 | Sharrit | 395/500 |
| 5,666,367 | 9/1997 | Troyanovsky | 371/22.1 |
| 5,689,685 | 11/1997 | Feldmann et al. | 395/500 |
| 5,712,805 | 1/1998 | Wang et al. | 364/574 |
| 5,787,004 | 7/1998 | Schmidt-Kreusel et al. | 364/484 |
| 5,808,915 | 9/1998 | Troyanovsky | 364/578 |

OTHER PUBLICATIONS

Aprille, Thomas J. et al., "Steady–State Analysis of Non-linear Circuits with Periodic Inputs," *Proceedings of the IEEE*, vol. 60, No. 1, Jan. 1972, pp. 108–114.

Kundert, Kenneth S. et al., "Time–Domain Methods," Chapter 4 of *Steady–State Methods of Simulating Analog and Microwave Circuits*, Mar. 1990, Kluwer Ac, Publisher, ISBN: 0–7923–9069–5 (1990/03) pp. 55–79.

Kundert, Kenneth S. et al., "Harmonic Balance Theory," Chapter 5 of *Steady–State Methods of Simulating Analog and Microwave Circuits*, Mar. 1990, Kluwer Ac, Publisher, ISBN: 0–7923–9069–5 (1990/03), pp. 81–116.

Kundert, Kenneth S. et al., "Implementing Harmonic Balance," Chapter 6 of *Steady–State Methods of Simulating Analog and Microwave Circuits*, Mar. 1990, Kluwer Ac, Publisher, ISBN: 0–7923–9069–5 (1990/03), pp. 117–156.

Kundert, Kenneth S. et al., "Mixed Frequency–Time Method," Chapter 7 of *Steady–State Methods of Simulating Analog and Microwave Circuits*, Mar. 1990, Kluwer Ac, Publisher, ISBN: 0–7923–9069–5 (1990/03), pp. 157–186.

Kundert, Kenneth S. et al., "Sparse Matrix Techniques," Chapter 6 of *Circuit Analysis, Simulation and Design*, 1986, Ruehli, A. E., Editor, Country of Publication: Netherlands, ISBN: 0–444–87893–9, pp. 281–324.

(List continued on next page.)

*Primary Examiner*—Paul R. Lintz
*Assistant Examiner*—Vuthe Siek
*Attorney, Agent, or Firm*—Townsend and Townsend and Crew LLP

[57] ABSTRACT

An efficient method for determining the periodic steady state response of a circuit driven by a periodic signal, the method including the steps of 1) using a shooting method to form a non-linear system of equations for initial conditions of the circuit that directly result in the periodic steady state response; 2) solving the non-linear system via a Newton iterative method, where each iteration of the Newton method involves solution of a respective linear system of equations; and 3) for each iteration of the Newton method, solving the respective linear system of equations associated with the iteration of the Newton method via an iterative technique. The iterative technique may be a matrix-implicit application of a Krylov subspace technique, resulting in a computational cost that grows approximately in a linear fashion with the number of nodes in the circuit.

8 Claims, 10 Drawing Sheets

OTHER PUBLICATIONS

Okumura, Makiko et al., "An efficient Small Signal Frequency Analysis Method of Nonlinear Circuits with Two Frequency Excitations," *IEEE Transactions on Computer–Aided Design*, vol. 9, No. 3, Mar. 1990, pp. 225–235.

Saad, Youcef et al., "GMRES: A Generalized Minimal Residual Algorithm for Solving Nonsymmetric Linear Systems," SIAM *J. Sci. Stat. Comput.*, vol. 7, No. 3, Jul. 1986, pp. 856–869.

Skelboe, Stig, "Computation of the Periodic Steady–State Response of Nonlinear Networks by Extrapolation Methods," *IEEE Transactions on Circuits and Systems*, vol. cas–27, No. 3, Mar. 1980, pp. 161–175.

Telichevesky, Ricardo et al., "Efficient AC and Noise Analysis of Two–One RF Circuits," Proceedings of the Jun. 1996, 33rd Annual Design Automation Conference, Conference, Las Vegas, Nevada, ISSN: 0146–7123, 6 pages.

Telichevesky, Ricardo et al., "Efficient Steady–State Analysis Based on Matrix–Free Krylov–Subspace Methods," Proceedings of the 1995, 32nd Annual Design Automation Conference, Jun. 1995, Conference in San Francisco, California, Issue No.: 0428133, 5 pages.

Telichevesky, Ricardo et al., "Spectre RF: New Simulation Techniques for RF Circuits," Presented at Cadence Technology Conference on May 10, 1995, 6 pages.

1301 determine J×J delay matrix, D(T), as follows:

D(T) = AB where A = 
$$\begin{bmatrix} 1 & \cos\omega_1(n_1+1)T & \sin\omega_1(n_1+1)T & \ldots & \cos\omega_K(n_1+1)T & \sin\omega_K(n_1+1)T \\ 1 & \cos\omega_1(n_2+1)T & \sin\omega_1(n_2+1)T & \ldots & \cos\omega_K(n_2+1)T & \sin\omega_K(n_2+1)T \\ 1 & \cos\omega_1(n_3+1)T & \sin\omega_1(n_3+1)T & \ldots & \cos\omega_K(n_3+1)T & \sin\omega_K(n_3+1)T \\ \vdots & \vdots & \vdots & & \vdots & \vdots \\ 1 & \cos\omega_1(n_J+1)T & \sin\omega_1(n_J+1)T & \ldots & \cos\omega_K(n_J+1)T & \sin\omega_K(n_J+1)T \end{bmatrix}$$

where B = 
$$\begin{bmatrix} 1 & \cos\omega_1 n_1 T & \sin\omega_1 n_1 T & \ldots & \cos\omega_K n_1 T & \sin\omega_K n_1 T \\ 1 & \cos\omega_1 n_2 T & \sin\omega_1 n_2 T & \ldots & \cos\omega_K n_2 T & \sin\omega_K n_2 T \\ 1 & \cos\omega_1 n_3 T & \sin\omega_1 n_3 T & \ldots & \cos\omega_K n_3 T & \sin\omega_K n_3 T \\ \vdots & \vdots & \vdots & & \vdots & \vdots \\ 1 & \cos\omega_1 n_J T & \sin\omega_1 n_J T & \ldots & \cos\omega_K n_J T & \sin\omega_K n_J T \end{bmatrix}^{-1}$$

Solve the equation:

$$D_N(T) = \begin{bmatrix} v(n_1 T) \\ v(n_2 T) \\ \vdots \\ v(n_J T) \end{bmatrix} - \begin{bmatrix} \phi(v(n_1 T), n_1 T, (n_1+1)T) \\ \phi(v(n_2 T), n_2 T, (n_2+1)T) \\ \vdots \\ \phi(v(n_J T), n_J T, (n_J+1)T) \end{bmatrix} = 0$$

using a Newton-iterative method, and solving the respective linear system arising on each Newton iteration via a matrix-implicit iterative technique, where $D_N(T) = \begin{bmatrix} d_{11}I_N & \ldots & d_{1J}I_N \\ d_{J1}I_N & \ldots & d_{JJ}I_N \end{bmatrix}$, where $d_{ij}$ is the ijth element of the delay matrix D(T), $I_N$ is the N×N identity matrix, and $\phi$ is the state transition function.

METHOD FOR DETERMINING THE STEADY STATE BEHAVIOR OF A CIRCUIT USING AN ITERATIVE TECHNIQUE

CROSS-REFERENCE TO RELATED APPLICATIONS

This application claims priority from Provisional Application No. 60/016,781, filed Apr. 30, 1996, the entire disclosure of which (including all attached documents) is hereby incorporated by reference.

BACKGROUND OF THE INVENTION

The present invention relates generally to the analysis of the steady-state behavior of circuits driven by a periodic input signal.

The rapid growth in the field of wireless RF telecommunications has provided significant motivation for the development of simulation tools that can quickly and accurately analyze both the steady-state behavior and the response to multiple-frequency excitations of nonlinear circuits. FIG. 1A depicts a generic circuit 10 that is frequently analyzed in engineering applications. Circuit 10 is driven by a periodic input signal 11, u(t), of arbitrary shape, and has an output 12, v(t), that is periodic with the same frequency as u(t) when circuit 10 has reached a steady state. There is a great need for computationally efficient techniques for determining the steady-state behavior of a circuit such as circuit 10, particularly given the fact that frequently the circuit behavior must be characterized over a wide range of input signal frequencies and amplitudes.

One traditional technique for determining a periodic steady-state solution (PSS) is transient analysis. This technique involves determining respective states of the circuit at a series of timepoints (starting at time zero with a set of initial conditions), the state determined for the circuit at any particular timepoint depending on the state determined for the circuit at the previous timepoint. The technique terminates upon detecting that a steady-state has been reached. Transient analysis requires several timepoints per period of the input signal, and thus is often impractical in circuits having a time constant many orders of magnitude greater than the period of the input signal. For example, FIG. 1B depicts a self-biased amplifier circuit 20 that is driven by a periodic input signal 21, u(t). The time constant of circuit 20 might be chosen to be several orders of magnitude larger than the largest possible period for u(t), thereby requiring transient analysis over thousands of timepoints.

Another prior art technique for obtaining the PSS solution for a circuit involves the use of the shooting-Newton method. This method uses a Newton iterative technique to compute a series of estimates for the PSS. The difference between each estimate in the series and the previous estimate is determined by solving a respective linear system of equations via Gaussian elimination. Obtaining the solution for each linear system by Gaussian elimination involves factorization of a dense N by N matrix, where N represents the number of nodes in the circuit, and thus requires a computation time that increases with the third power of N. For this reason, prior art shooting-Newton techniques for obtaining a PSS solution are often impractical for circuits with a large number of nodes.

Another prior art technique for obtaining a PSS solution involves the use of a finite-difference method. Such a method discretizes the circuit differential equations at a set of timepoints spanning an interval of the input signal to obtain a set of difference equations. Solution of this set of difference equations provides a PSS solution for each of the timepoints simultaneously. Like the previous PSS methods discussed, PSS techniques based on finite-difference methods typically have a computational cost that grows as the cube of the number of circuit nodes, and thus also may be impractical for large circuits.

FIG. 1C depicts another type of generic circuit 30 that is frequently analyzed in engineering applications. Circuit 30 is driven by two periodic input signals 31–32, $u_l$ and $u_s$. $u_s$ is a small sinusoidal signal of much smaller amplitude than $u_l$. $u_l$ is periodic with arbitrary shape. One approach to the solution of circuit 30 is transient analysis. Transient analysis may be a very expensive option, particularly where one of the input signals is of much higher frequency than the other. For example, FIG. 1D depicts a switched-capacitor filter circuit 40 driven by a periodic signal $u_s$ to be filtered and a high frequency clock signal $u_l$ that controls the state of a transistor 41. To ensure accurate results, transient analysis must cover several timepoints per period of the high frequency clock $u_l$, even though the frequency of the filtered signal $u_s$ is much lower.

Another approach to studying the behavior of circuit 30, known as Periodic Time-Variant Analysis (PTV), treats the small input signal, $u_s$, as a small perturbation to the periodic steady-state (PSS) response of circuit 30 to $u_l$ when $u_s$=0. In particular, typically, a small-signal steady-state response is determined at a set of time points spanning a period of $u_l$, by linearizing the differential equations for circuit 30 about the PSS response, and then discretizing the resulting system at the set of time points. Such a technique has a computational cost that grows with the third power of the number of circuit nodes, and for this reason, is impractical for large circuits.

FIG. 1E depicts another generic circuit 50 of a type frequently analyzed in engineering applications (e.g., mixer circuits). Circuit 50 is driven by d periodic signals 51 of unrelated frequencies, and typically has a steady-state response 52 that is quasiperiodic in d frequencies. One approach to determining a quasiperiodic response involves the use of mixed frequency-time methods as described in detail in chapter 7 of the text "Steady-State Methods for Simulating Analog and Microwave Circuits" by Kundert et al. However, such methods typically have a computational cost that grows with the third power of the number of circuit nodes, and for this reason, are impractical for large circuits.

SUMMARY OF THE INVENTION

As discussed above in the background section, various prior art techniques for steady-state and small signal analysis have a computational cost that grows with the third power of the number of circuit nodes, and are thus impractical for large circuits. By contrast, the present invention provides efficient techniques for steady-state and small signal analysis having a computational cost that is approximately linear in the number of circuit nodes. These techniques are, thus, practical for large circuits that cannot be feasibly handled by prior art techniques.

In particular, the present invention provides an efficient method for determining the periodic steady state response of a circuit driven by a periodic signal, the method including the steps of 1) using a shooting method to form a non-linear system of equations for initial conditions of the circuit that directly result in the periodic steady state response; 2) solving the non-linear system via a Newton iterative method, where each iteration of the Newton method involves solution of a respective linear system of equations; and 3) for each iteration of the Newton method, solving the respective linear system of equations associated with the iteration of the Newton method via a matrix-implicit iterative technique.

In one embodiment, the iterative technique is a matrix-implicit application of a Krylov subspace technique, resulting in a computational cost that grows approximately in a linear fashion with the number of nodes in the circuit, in contrast to typical shooting methods used to obtain a periodic steady state response whose computational cost grows with the cube of the number of circuit nodes. Thus, the disclosed method renders feasible periodic steady state analysis of circuits much larger than those that could be analyzed via previous methods. In addition, the invention provides an efficient finite-difference technique for obtaining a PSS solution, the technique having a computational cost that also grows approximately in a linear fashion with the number of nodes in the circuit. An efficient technique that is almost linear in the number of circuit nodes is also provided for determining a quasiperiodic steady-state response of a circuit driven by two or more signals of unrelated frequencies.

The present invention also provides an efficient method for determining the small-signal steady state response to a small periodic signal of a circuit driven by a large periodic signal, the small-signal steady state response covering a plurality of timepoints that span a period of the large periodic signal. The method includes the steps of 1) forming a linear system of equations for the small-signal steady state response at the last of the timepoints; and 2) solving the linear system of equations via a matrix-implicit iterative technique.

In one embodiment, the iterative technique is a matrix-implicit application of a Krylov subspace technique, resulting in a computational cost that grows approximately in a linear fashion with the number of nodes in the circuit. This is in contrast to typical methods which use Gaussian elimination to solve the above linear system and whose computational cost grows with the cube of the number of circuit nodes. Thus, the disclosed method renders feasible small signal analysis of circuits much larger than those that could be analyzed via previous methods. The efficiency of the disclosed method is particularly important given that, typically, a small signal response is required for a range of frequencies.

In addition, the invention provides a technique for reusing ("recycling"), during the determination of the small-signal steady-state response for a particular small signal frequency, matrix-vector products previously obtained during the determination of the small-signal steady-state response for another small signal frequency.

A further understanding of the nature and advantages of the present invention may be realized by reference to the remaining portions of the specification and the drawings.

Figure 3:
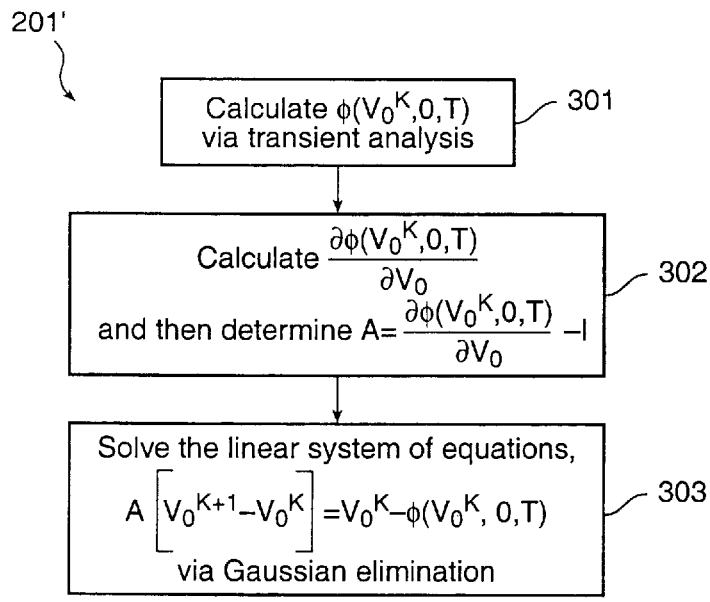
FIG. 3 is a flowchart for carrying out step 201 of FIG. 2.

as required for step 302 of FIG. 3.

Figure 7:
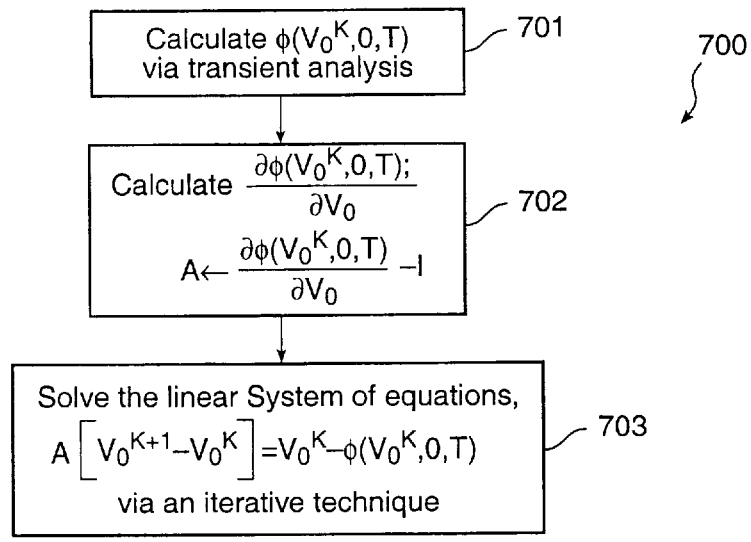

FIG. 7 is a flowchart for a technique in accordance with the invention for obtaining a PSS solution.

Figure 8:
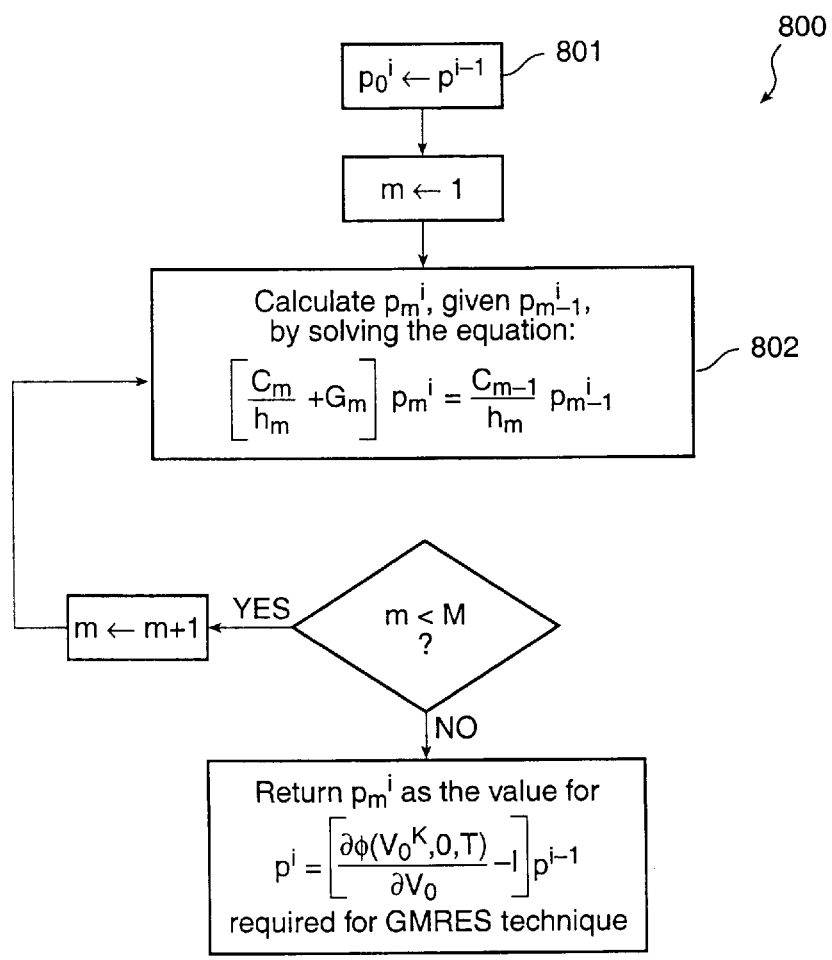

FIG. 8 is a flow chart for a technique in accordance with the invention to determine $Ap^{i-1}$, which is required for step 701 of FIG. 7.

Figure 1A:
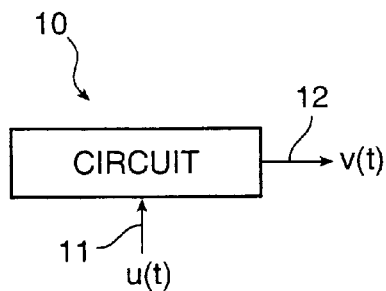
FIG. 1A depicts a generic circuit driven by a periodic signal of arbitrary shape.
Figure 1B:
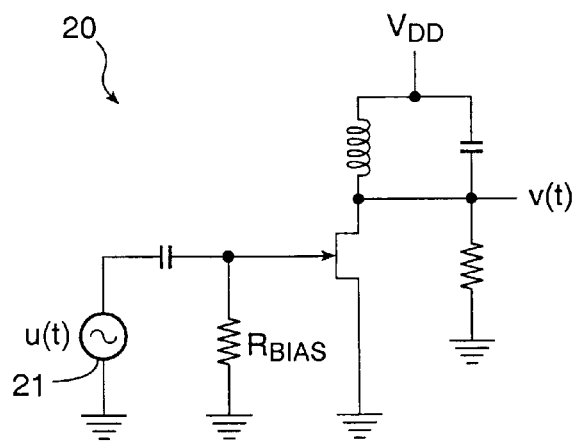
FIG. 1B depicts an example of the circuit type of FIG. 1A, i.e., a self-biased amplifier circuit that is driven by a periodic input signal.
Figure 1C:
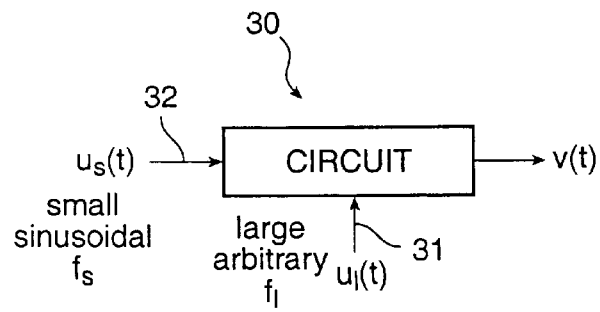
FIG. 1C depicts a generic circuit driven by two signals, a first periodical signal of arbitrary shape and a second much smaller sinusoidal signal.
Figure 1D:
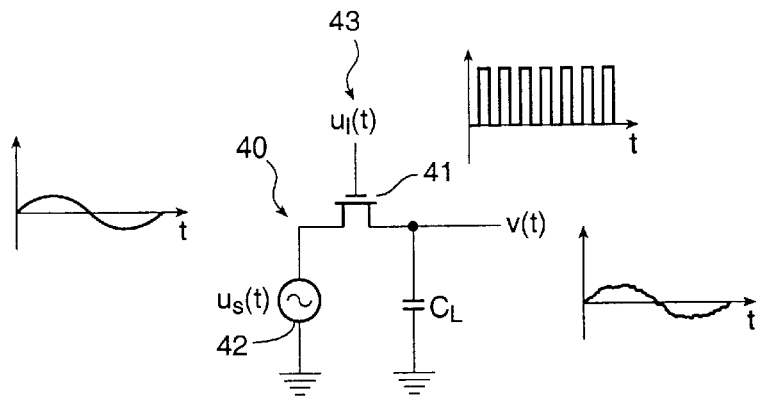
FIG. 1D depicts an example of the circuit type of FIG. 1C, i.e., a switched-capacitor filter circuit driven by a periodic signal to be filtered and a high frequency clock signal that controls the state of a transistor.
Figure 9:
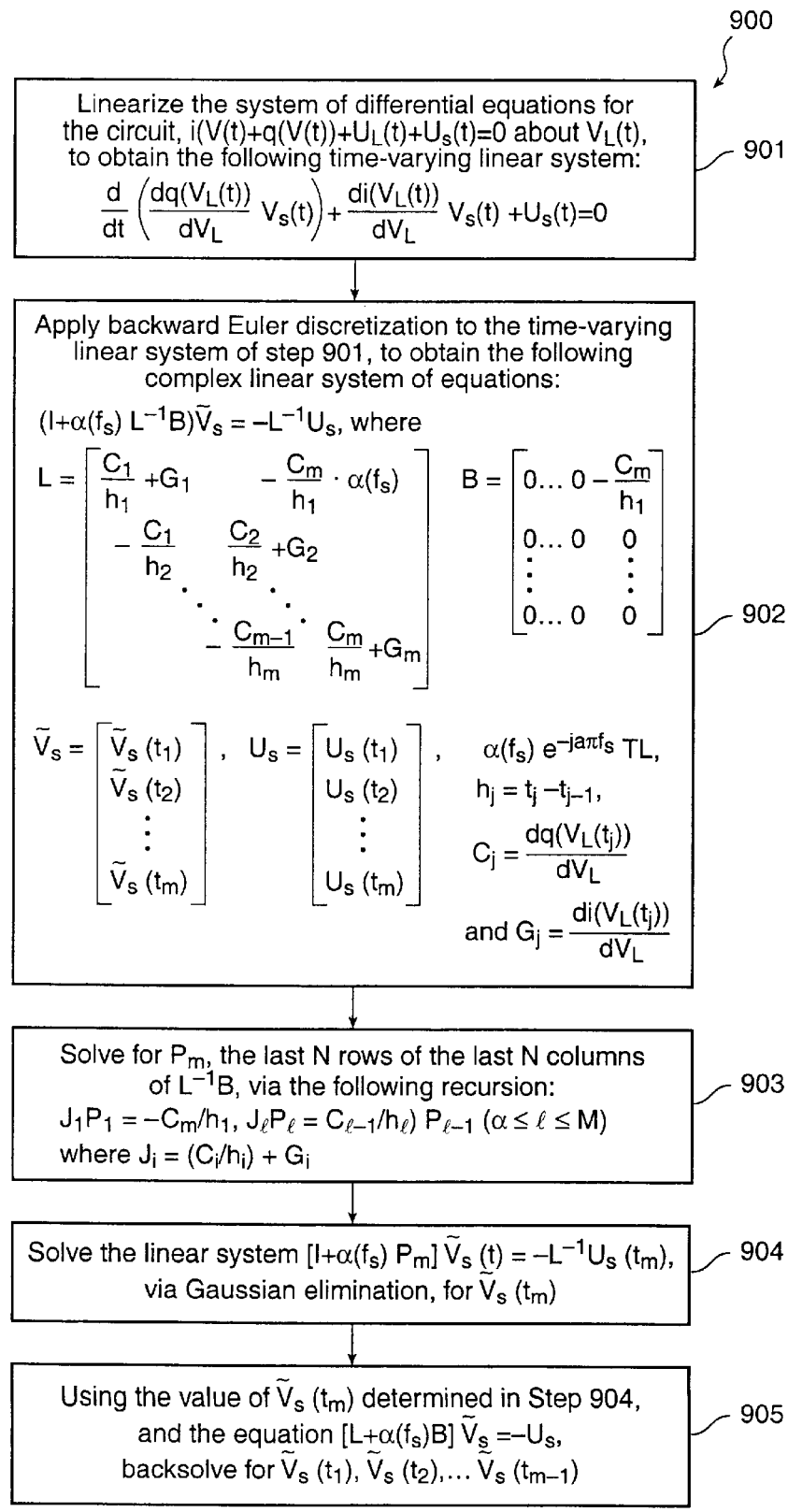

FIG. 9 is a flowchart for a technique in accordance with the invention for obtaining a small signal response of the circuit of FIG. 1C.

Figure 10:
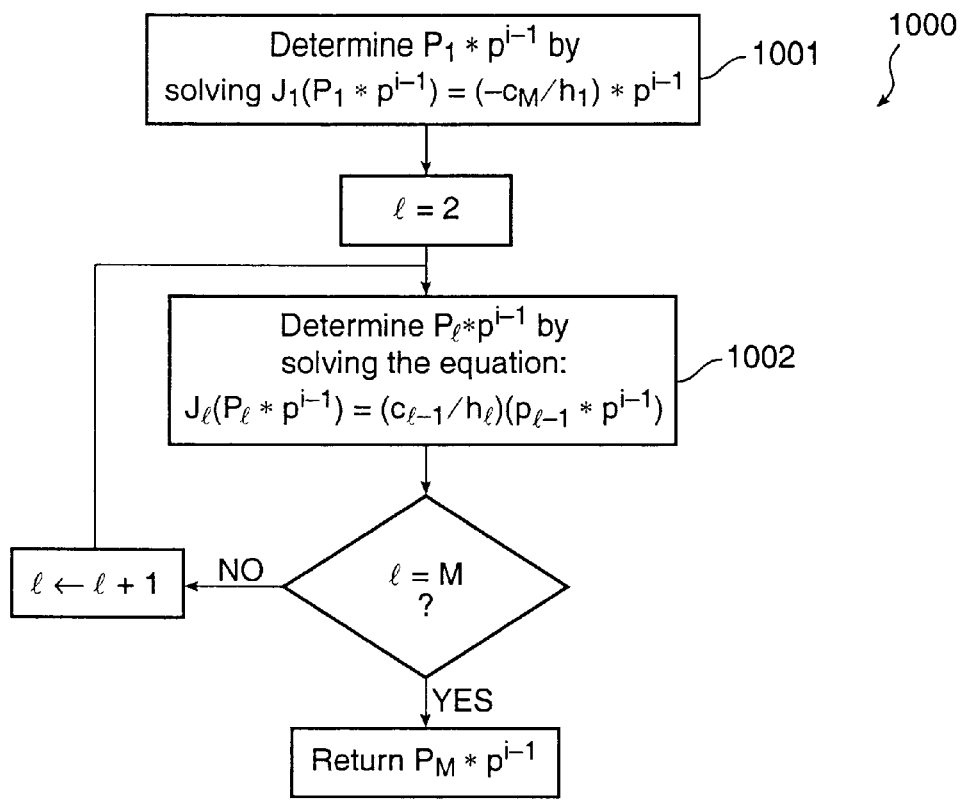

FIG. 10 is a flowchart for a matrix-implicit application of a Krylov subspace technique for solving the linear system of step 904 in FIG. 9, and in particular for determining $P_M*p^{i-1}$ during the ith iteration of the Krylov technique.

Figure 11B:
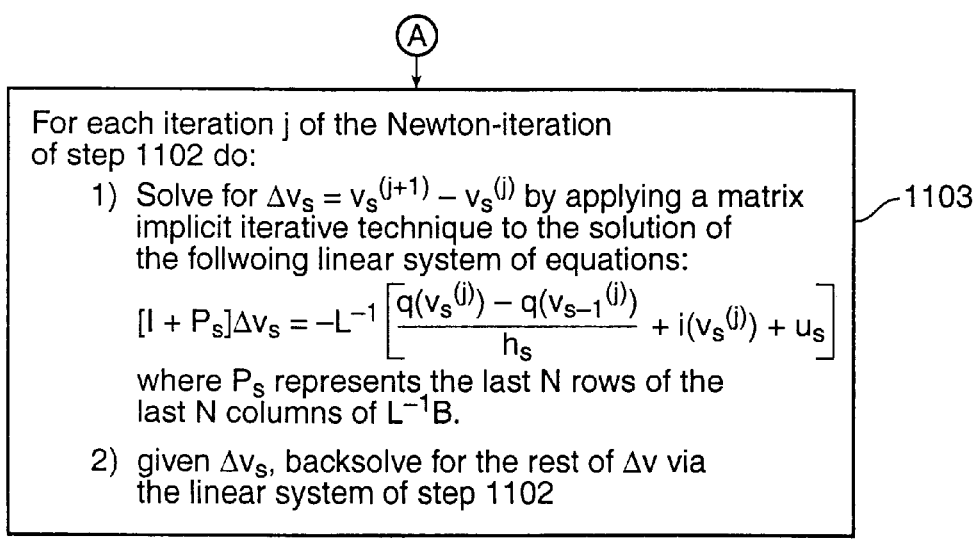
Figure 11A:
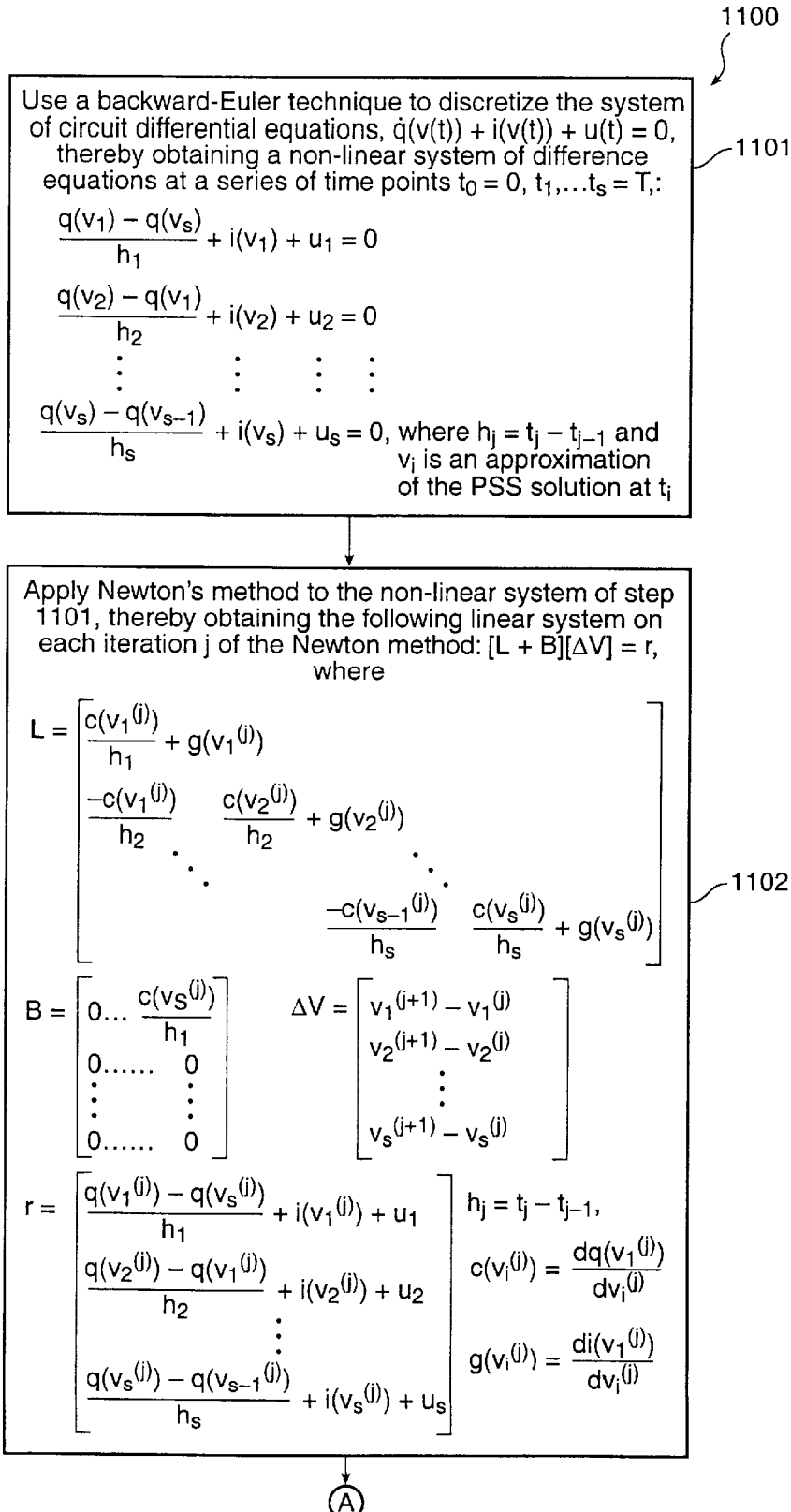

FIGS. 11A–B depict a flowchart for a finite-difference technique in accordance with the invention for obtaining a periodic steady-state solution (PSS) for the circuit of FIG. 1A.

Figure 12:
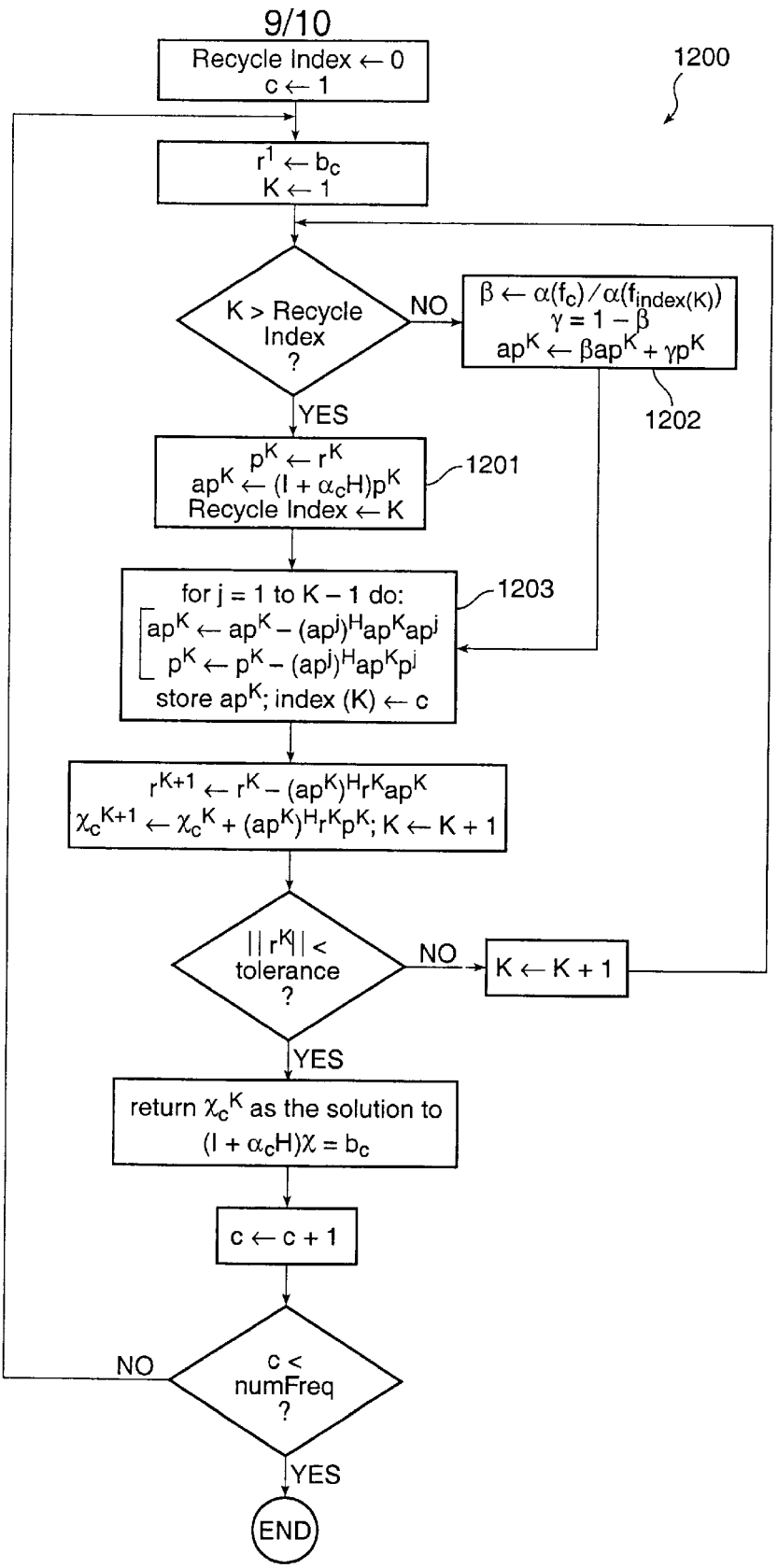

FIG. 12 is a flowchart for a technique for recycling matrix-vector products when determining two or more small signal responses.

Figure 1E:
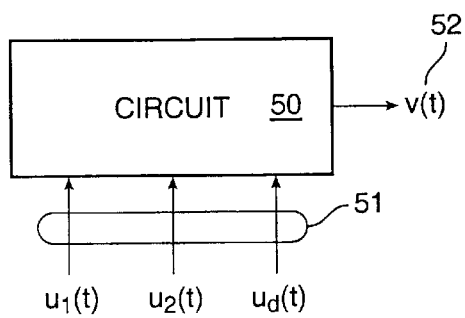
FIG. 1E depicts a generic circuit that is driven by d periodic signals of unrelated frequencies.

FIG. 13 is a flowchart for obtaining a quasiperiodic solution of the circuit of FIG. 1E via a mixed frequency-time technique.

DESCRIPTION OF SPECIFIC EMBODIMENTS

Periodic Steady-State Analysis Via Shooting-Newton Methods

As noted above, FIG. 1A depicts a generic circuit 10 that is frequently analyzed in engineering applications. Circuit 10 is driven by an arbitrary periodic input signal 11, u, and has an output 12, v(t), that shares a common period with u when circuit 10 has reached a steady state. The nodal voltages of circuit 10 are characterized by a series of N equations:

$$\frac{d\,q(v(t))}{dt} + i(v(t)) + u(t) = 0 \qquad (1)$$

where N is the number of nodes in circuit 10, $u(t) \in R^N$ is the vector of input sources (each member of u is periodic with period T), $v(t) \in R^N$ is the vector of node voltages, and $q(v(t)) \in R^N$ is the vector of node charges.

$$\frac{d\,q(v(t))}{dt},$$

i(v(t)), and u(t) represent capacitive, resistive and input currents, respectively. The periodic steady-state solution, V, for the nodal voltages of the circuit is the solution that satisfies equation (1) and in addition satisfies the two-point constraint:

$$V(T)=V(0) \qquad (2)$$

Shooting methods reformulate the problem of solving equations (1) and (2) as the problem of finding V(0) satisfying:

$$\phi(V(0),0,T)-V(0)=0 \qquad (3)$$

where $\phi$ is the state-transition function for the circuit, i.e., $\phi(V(0), 0, t)$ represents the vector of node voltages at time t given that the vector of node voltages at time zero is V(0). In other words, shooting methods involve solving for initial conditions of the circuit, V(0), that directly result in the periodic steady-state solution, i.e. that result in those same conditions one period later at time T.

Figure 2:
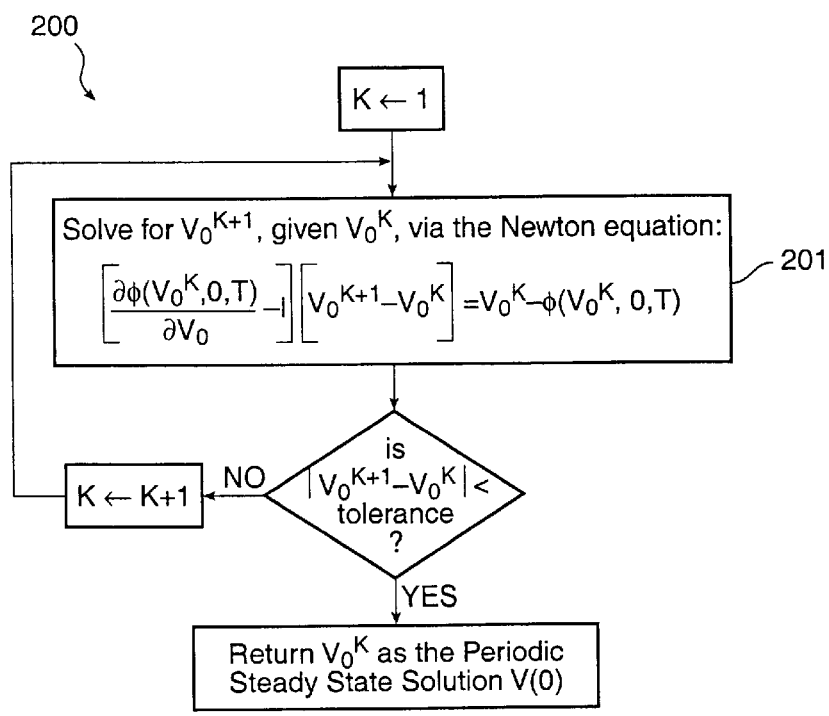
FIG. 2 is a flowchart for a Newton method for obtaining a periodic state solution (PSS).

Equation (3) is in general a non-linear algebraic equation and can be solved by Newton's method. FIG. 2 depicts a flow-chart for solving equation (3) via Newton's method according to the prior art. Applying this method to equation (3) results in the following iterative equation (step 201):

$$\left[\frac{\partial \phi(V_0^k, 0, T)}{\partial V_0} - I\right][V_0^{k+1} - V_0^k] = V_0^k - \phi(V_0^k, 0, T) \qquad (4)$$

where I is the N×N identity matrix. Each iteration of equation (4) requires the solution (step 201) of a linear system of equations Ax=b, where $$A = \frac{\partial \phi(V_0^k, 0, T)}{\partial V_O} - I, \quad \text{and } b = V_0^k - \phi(V_0^k, 0, T).$$

Figure 4:
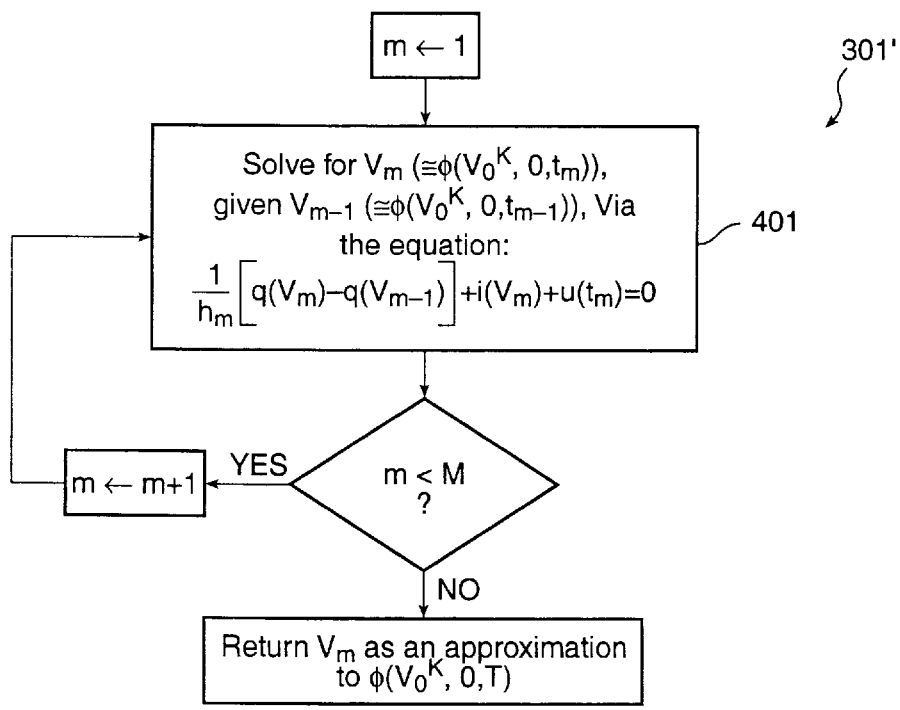
FIG. 4 is a flowchart for carrying out step 301 of FIG. 3.

FIG. 3 depicts a flowchart 201' for the best prior art technique known to the inventors for carrying out step 201 of FIG. 2, and involves 3 basic steps, each of which is described in greater detail below:

a) calculation of $\phi(V_0^k,0,T)$—step 301

$$\frac{\partial \phi(V_0^k, 0, T)}{\partial V_0} - \text{step } 302$$

c) solution of Ax=b via Gaussian elimination—step 303
a: calculation of $\phi(V_0^k,0,T)$—Step 301
FIG. 4. depicts a flowchart 301' for carrying out step 301 of FIG. 3. In particular, FIG. 4 illustrates a technique for computing $\phi(V_0^k,0,T)$ through transient analysis using a backward-Euler integration method. Using this method, equation (1) is discretized over M timepoints $t_0, t_1 \ldots t_M$ to yield the following equation for m=1, 2, ... M (step 401):

$$\frac{1}{h_m}[q(V_m) - q(V_{m-1})] + i(V_m) + u(t_m) = 0 \qquad (5)$$

where $t_0=0$, $t_M=T$, $h_m=t_m-t_{m-1}$, $V_0=V_0^k$ and $v_m=\phi(V_0^k,0,t_m)$, for m=1,2, ... M. The value determined for $V_M$ is an approximation for $\phi(V_0^k,0,T)$.

Figure 5:
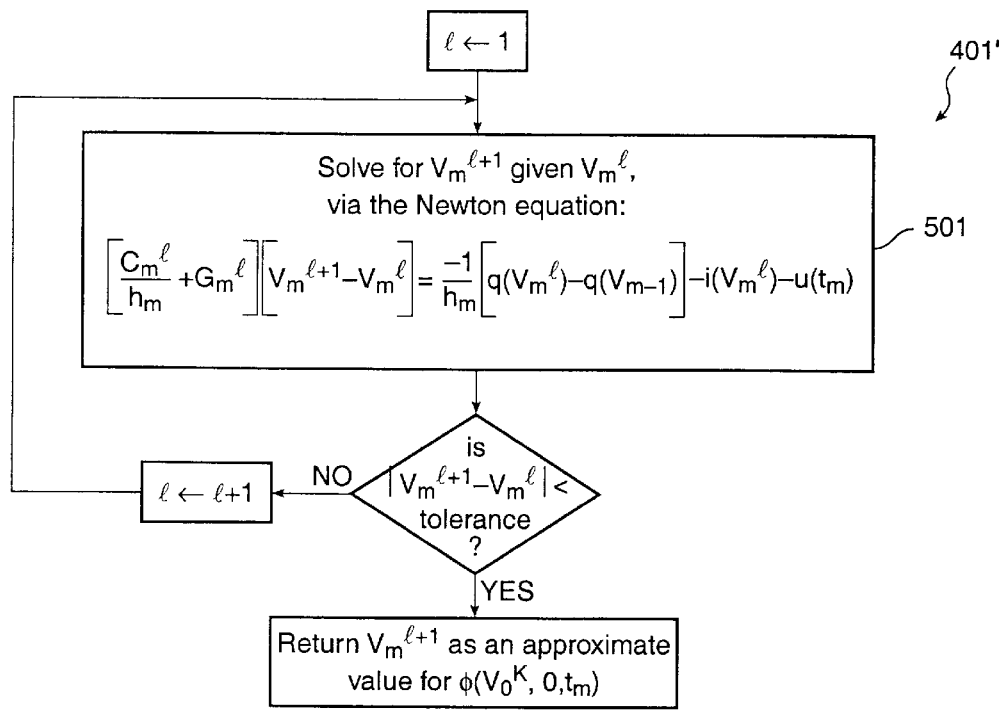
FIG. 5 is a flowchart for solving the equation of step 401 of FIG. 4 via Newton's method.

FIG. 5 illustrates a flowchart 401' for solving the equation of step 401 (FIG. 4) via Newton's method. Using this method to solve equation (5) for $V_m$, m=1, ... M, yields the following iteration where l is the Newton iteration index (step 501):

$$\left[\frac{C_m^l}{h_m} + G_m^l\right][V_m^{l+1} - V_m^l] = \frac{-1}{h_m}[q(V_m^l) - q(V_{m-1})] - i(V_m^l) - u(t_m) \qquad (6)$$

where $$C_m^l = \frac{\partial q(V_m^l)}{\partial V_m} \quad \text{and} \quad G_m^l = \frac{\partial i(V_m^l)}{\partial V_m}$$

Figure 6:
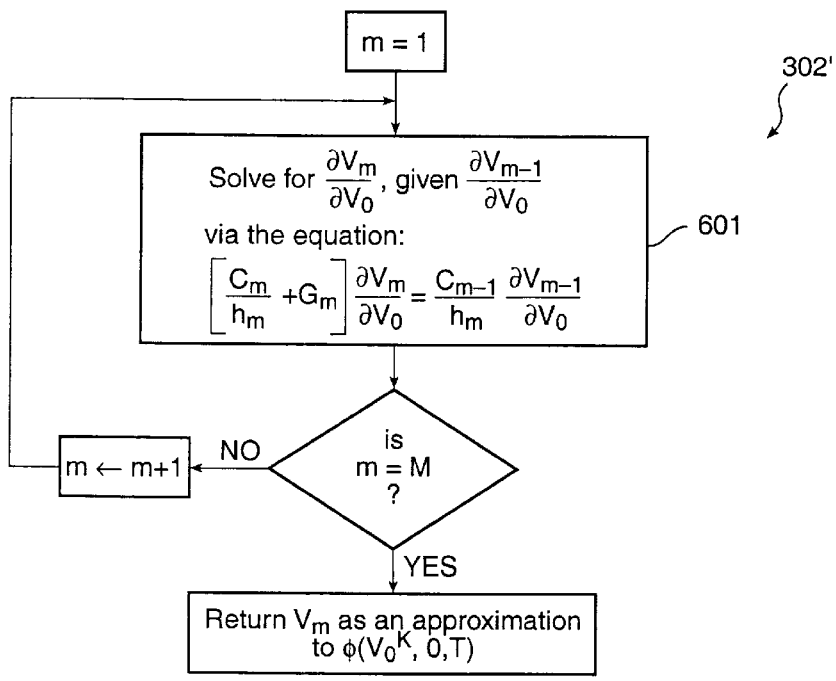
FIG. 6 is a flowchart for calculating $$\frac{\partial \phi(V_0^k, 0, T)}{\partial V_0}$$

The computational cost of computing $\phi(V_0^k,0,T)$ via transient analysis is approximately of order MN(O(MN)) where, as noted above, N is the number of circuit nodes and M is the number of timepoints.

b: Calculation of $\partial\phi(V_0^k,0,T)/\partial V_0$—Step 302
FIG. 6 illustrates a flowchart 302' for calculating $$\frac{\partial \phi(V_0^k, 0, T)}{\partial V_0}$$

as required for step 302 (FIG. 3).
Differentiating both sides of equation 5 with respect to $V_0$ and applying the chain rule yields the following equation for calculating $\partial V_m/\partial V_0$ given $\partial V_{m-1}/\partial V_0$, m=1,2, ... M (step 601):

$$\left[\frac{C_m}{h_m} + G_m\right]\frac{\partial V_m}{\partial V_0} = \frac{C_{m-1}}{h_m}\frac{\partial V_m}{\partial V_0} \qquad (7)$$

where $C_m=C_m^L$, $G_m=G_m^L$, and L is the last value of l before convergence occurs in the calculation of $V_m$ via equation 6.

By repeated application of equation (7) for m=1,2, ... M with the initial condition $\partial V_0/\partial V_0$=I, $\partial V_M/\partial V_0$, i.e., $\partial\phi(V_0^k,0,T)/\partial V_0$, can be determined. The values of $C_m$, $G_m$ and $C_{m-1}$ are available from the above computation of $\phi(V_0^k,0,T)$ via equation (6).

Defining the cost of computing each column in $\partial V_m/\partial V_0$ to be O(Sp), the cost per time-step m of computing $\partial V_m/\partial V_0$ is O(NSp), given that the matrix $\partial V_{m-1}/\partial V_0$ is dense. O(Sp) is nearly O(N) given that there are only a few non-zero entries per row, representing element connectivity, in the sparse matrix $C_m/h_m+G_m$. Thus, the total cost of computing $\partial V_M/\partial V_0$ is O(MNSp), i.e., approximately O(MN²).

c: Solution of Ax=b via Gaussian elimination—Step 303
The computational cost of obtaining this solution is O(N³), given that the matrix $A=\partial\phi(V_0^k,0,T)/\partial V_0$-I is a dense N×N matrix. Thus, the total computational cost of obtaining the periodic steady state (PSS) solution via the above technique is approximately O(MN²+N³). This cost, which grows as the cube of the number of circuit nodes, becomes prohibitive for large circuits.

FIG. 7 illustrates a flowchart 700 for one possible method according to the invention of lowering the cost of obtaining a PSS solution. The method carries out steps a and b, as described above, but solving the linear system Ax=b via an iterative technique (step 701) instead of using Gaussian elimination. One possible such technique is the GMRES algorithm presented immediately below in simplified form and described in the paper by Saad, et al., entitled "GMRES: A Generalized Minimal Residual Algorithm for Solving Nonsymmeteric Linear Systems" (*SIAM J. SCI. STAT. COMPUT.*, Vol. 7, No. 3, July 1986):

Algorithm I (GMRES algorithm for solving Ax = b)
Guess at a solution, $x^0$.
Initialize the search direction $p^0 = b - Ax^0$
Set i = 1.
do {
    Compute the new search direction, $p^i = Ap^{i-1}$.

Orthogonalize, $p^i = p^i - \sum_{j=0}^{i-1} \beta_{i,j} p^j$.

Choose $\alpha_i$ in
        $x^i = x^{i-1} + \alpha_i p^i$
    to minimize $\|r^i\| = \|b - Ax^i\|$.
    If $\|r^i\| <$ tolerance$_{gmres}$, return $x^i$ as the solution.
    else Set i = i + 1.
}

The dominant cost in Algorithm 1 is $O(N^2)$ and results from the $N^2$ operations required to compute $Ap^{i-1}$ on each GMRES iteration i. In addition, as described above in the discussion of step b, the cost associated with determining $\partial \phi(V_0^k,0,T)/\partial V_0$ (which is required for the computation of A) is approximately $O(MN^2)$. Thus, the total computational cost of obtaining a PSS solution using Algorithm 1 is $O(MN^2)$. For large circuits, this cost may still be prohibitive.

One approach to further reducing the cost of obtaining a PSS solution is to use a technique that solves the linear system of equations Ax=b without calculating the matrix A, thereby avoiding the approximately $O(MN^2)$ cost of calculating $\partial \phi(V_0^k,0,T)/\partial V_0$. Such a technique is referred to herein as a "matrix-implicit" technique.

One possible matrix-implicit technique is based on the insight that the GMRES iterative algorithm (as presented above) does not require the value of A, but rather only the value of $Ap^{i-1}$, for each GMRES iteration i. The values of $Ax^0$ and $Ax^i$, required for the initialization and minimization steps, respectively, of the GMRES algorithm, can be determined without calculating the value of A, via the same techniques presented immediately below for calculating the value of $Ap^{i-1}$.

The approximate value of $Ap^{i-1}$ is given by the following equation:

$$Ap^{i-1} \cong \frac{\phi(V_0^k + \epsilon p^{i-1}, 0, T) - \phi(V_0^k, 0, T)}{\epsilon} - p^{i-1} \quad (8)$$

$Ap^{i-1}$ can be evaluated in approximately O(MN) time via equation (8), using the above-described backward-Euler integration method to determine $\phi(V_0^k,0,T)$ and $\phi(V_0^k+\epsilon p^{i-1},0,T)$.

FIG. 8 illustrates a flow chart 800 for a more computationally efficient and robust technique to determine $Ap^{i-1}$, also having an approximately O(MN) computational cost. An initial value for $p^i$, i.e., $p_0^i$ is set to $p^{i-1}$ (step 801). Then a sequence of values $P_m^i, 1 \leq m \leq M$, are determined via the following recurrence relation (step 802):

$$\left[\frac{C_m}{h_m} + G_m\right] p_m^i = \frac{C_{m-1}}{h_m} p_{m-1}^i \quad (9)$$

Since the matrix $$\left[\frac{C_m}{h_m} + G_m\right]$$

is sparse, the computational cost of determining $p_m^i$ via equation 9 is O(Sp), where O(Sp) is nearly O(N). Thus, the cost of determining $P_M^i(=Ap^{i-1})$, via repeated application of equation (9), is O(MSp). As described above, the cost of obtaining $\phi(V_0^k,0,T)$ is also O(MSp). Thus, the above method for obtaining a PSS solution via a matrix-free application of the GMRES technique is nearly linear in N, the number of circuit nodes, and thus is suitable for the analysis of circuits much larger than those that could be feasibly handled by previous methods.

In a preferred embodiment, for m=1,2, ... M, the matrix $C_m$ and the factored form of the matrix $[C_m/h_m+G_m]$ determined for the last iteration of equation (6) in the computation of $V_m$ are stored in memory, thereby eliminating the need to recompute these matrices when solving equation (9). Given that the structure (i.e. locations of non-zero elements) of the matrices $C_m$ and $[C_m/h_m+G_m]$ does not vary with m, the amount of storage required can be substantially reduced by storing each matrix as a compact series of non-zero elements and storing first and second sets of structural information defining the structure of all of the matrices $C_m$, and the structure of all of the matrices $[C_m/h_m+G_m]$, respectively.

The GMRES algorithm discussed above is a member of the well known class of Krylov subspace (hereinafter "Krylov") techniques. Each Krylov technique provides an iterative method for solving a linear system of equations Ax=b, and could substitute for GMRES in the above discussion of FIGS. 7 and 8. The dominant cost in each iteration i of a Krylov technique is associated with computing the product $Ap^{i-1}$, where $p^{i-1}$ represents a search direction vector computed in the previous iteration. However, the matrix A itself is not required in a Krylov technique, and thus, as described herein, such a technique can be used not only to solve a linear system iteratively but also in a matrix-implicit manner.

Periodic Small Signal Analysis

As noted above, FIG. 1C illustrates a generic circuit 30, driven by two periodic signals 31 and 32, $u_l$ and $u_s$. $u_l$ is an arbitrarily shaped large signal with period $T_L$. $u_s$ is a small sinusoidal signal of the form $u_s(t) = \text{Re}[A \cdot e^{j2\pi f_s t}]$.

FIG. 9 illustrate a flowchart 900 for one technique, known as Periodic Time-Variant (PTV) analysis, that has been used to solve for the nodal voltages of circuit 30 when $u_s$ is small relative to $u_l$. PTV analysis treats the effect of $u_s(t)$ as a small perturbation $V_s(t)$ (also sometimes referred to as the "small signal response") to the steady-state response $V_L(t)$ of circuit 30 to $u_l(t)$ when $u_s(t)=0$. This steady-state response can be determined by any of the PSS techniques disclosed herein (such as Newton-shooting or finite-difference methods), or any other PSS technique. PTV analysis is described in more detail in the Background Section of the paper "Efficient AC and Noise Analysis of Two-Tone RF circuits" by Telichevesky et al (in *Proceedings of the* 1996 *Design Automation Conference*, June 1996).

An initial step in PTV analysis involves linearizing the system of differential equations for the nodal voltages of circuit 30 about $V_L(t)$, thereby obtaining a time-varying linear system for the small signal response (step 901). Next, in step 902, the time-varying system obtained in step 901 is discretized via a backward-Euler technique to obtain a complex linear system for $\hat{v}_s(t)$ (an approximation to $V_s(t)$ at M timepoints $t_1, t_2, \ldots, t_M$ spanning one period of $u_l$ (i.e., $t_M = T_L$). $\hat{v}_s$ and $u_s$ are N×M-length vectors created by concatenating all of the timesteps together. L is an N×M by N×M block lower bidiagonal real matrix with blocksize N by N, and B is a block upper triangular real matrix with only one nonzero N by N block in the upper right-hand corner.

The top right entry of matrix L arises from the following equation applicable to a sinusoidal $u_s$:

$$V_s(t+T_L) = V_s(t) e^{j2\pi f_s T_L} \qquad (10)$$

Equation (10) permits the determination of the small signal response $V_s$ at an arbitrary time, given a characterization of $V_s$ over any interval of length $T_L$. The constraint imposed by equation (10), i.e. a sampled sinusoidal constraint, eliminates any transient behavior and ensures that the time-varying linear system of differential equations of step 901 has a unique solution.

One important aspect of the equation of step 902 is that the MN by MN matrix $L^{-1}B$ has non-zero entries only in the last N columns. This feature simplifies the solution of $\hat{v}_s(t_M)$, as described below with respect to steps 903-4. In the step 903, $P_M$ is solved via the following recursion:

$$J_1 P_1 = -C_M/h_1; J_l P_l = (C_{l-1}/h_l) P_{l-1} \qquad (11)$$

where $2 \leq l \leq M$, $J_i = (C_i/h_i) + G_i$, and $P_i$ represents the $((i-1)N)+1$ through iN rows of the last N columns of $L^{-1}B$.

In step 904, the linear system $[I + \alpha(f_s) P_M] \hat{v}_s(t_M) = -L^{-1} u_s(t_M)$ is solved via Gaussian elimination. Given that the matrix $[I + \alpha(f_s) P_M]$ is dense, the computational cost of step 904 is $O(N^3)$. Finally, in step 905, the value of $\hat{v}_s(t_M)$ determined in step 904 is used to backsolve for $\hat{v}_s(t_{M-1})$, $\hat{v}_s(t_{M-2})$, $\ldots \hat{v}_s(t_1)$ via the equation $[L + \alpha(f_s) B] \hat{v}_s = -u_S$. Thus, the computational cost associated with the technique of FIG. 9 grows as the cube of the number of circuit nodes. For this reason, the technique is not feasible for very large circuits.

One alternative to Gaussian elimination for solving the linear system of step 904 is an iterative technique such as GMRES, described above. In particular, an iterative technique that would not explicitly compute the matrix $[I + \alpha(f_s) P_M]$ (and thus $P_M$) would be desirable. Such a "matrix-implicit" technique would avoid the $O(N^3)$ and approximately $O(MN^2)$ computational costs associated with steps 904 and 903, respectively.

One group of iterative techniques that could be used to solve the linear system of step 904 is the class of Krylov subspace techniques. As discussed above, the dominant cost of a Krylov subspace technique used to solve the linear system $Ax = b$ is associated with the computation, during each iteration i, of $Ap^{i-1}$, where $p_0$ represents an initial search direction vector and $p^{i-1}$ represents a search direction vector computed in the previous iteration. However, the matrix A itself is not required, and thus, as described herein, a Krylov technique can be used not only to solve a linear system iteratively but also in a matrix-implicit manner.

FIG. 10 is a flowchart 1000 illustrating a matrix-implicit application of a Krylov subspace technique to solving the linear system of step 904, and in particular to determining $P_M * p^{i-1}$ during the ith iteration of the Krylov technique. In step 1001, $p_1 * p^{i-1}$ is determined by solving the system $J_1(p_1 * p^{i-1}) = -(C_M/h_1) * p^{i-1}$. In step 1002, the quantities $P_2 * p^{i-1}, P_3 * p^{i-1}, \ldots P_M * p^{i-1}$ are determined in turn by solving the following recursion for $l = 2, \ldots M$ $$J_l(P_l * p^{i-1}) = (C_{l-1}/h_l)(P_{l-1} * p^{i-1})$$

The value for $\hat{v}_s(t_M)$ returned from the final iteration of the Krylov technique is used as indicated in step 905 to backsolve for $\hat{v}_s(t_{M-1}), \ldots, \hat{v}_s(t_1)$.

Given that the matrices $J_i$ are sparse, the cost of solving for each vector $P_1 * p^{i-1}$ is approximately $O(N)$, and thus the cost of obtaining $P_M * p^{i-1}$ and of obtaining $\hat{v}_s(t_M)$ is approximately $O(MN)$. Using a matrix-implicit application of a Krylov technique in the above manner, to obtain the small signal response at the last of a series of timesteps spanning a period of the large input signal $u_l$, results in an approximately $O(MN)$ cost for the computation of the small signal response, $\hat{v}_s$, over the period. Given that this technique is approximately linear in N (the number of circuit nodes), it (unlike the $O(N^3)$ technique of FIG. 9) can be feasibly applied to very large circuits. The importance of an efficient technique for determining a small signal response is enhanced by the fact that frequently such a response is required for each of a multitude of small signal frequencies in order to adequately characterize the circuit in question.

Recycling Matrix-Vector Products During Small Signal Analysis For A Range Of Frequencies Another technique for further speeding up small signal analysis involves reusing matrix-vector products computed, as described above, during a matrix-implicit Krylov solution of $[I + (f_1) P_M] \hat{v}_s(t_M) = -L^{-1} u_s(t_M)$ (where $u_s$ is a sinusoidal of a first frequency $f_1$) to the solution of $[I + (f_2) P_M] \hat{v}_s(t_M) = -L^{-1} u_s(t_M)$ (where $u_s$ is a sinusoidal of a second frequency $f_2$). In particular, a matrix-vector product $A_2 p^k$ required during the kth Krylov iteration for frequency $f_2$, can be determined from a matrix-vector product $A_1 p^k$, computed during the kth Krylov iteration for frequency $f_1$ via the following equation:

$$A_2 p^k = \beta A_1 p^k + \gamma p^k \qquad (12)$$

where $A_i = [I + (f_i) P_M]$, $i = 1, 2$, $\beta = (f_2)/(f_1)$ and $\gamma = 1 - \beta$.

FIG. 12 is a flowchart 1200 for a technique to solve the system $(I + _cH) x = b_c$, over a range of small signal frequencies, $f_1, f_2, \ldots f_{NumFreq}$, where $_c = (f_c)$, $H = P_M$, $x = \hat{v}_s(t_M)$, $b_c = -L^{-1} u_s(t_M)$, and $u_s$ is a sinusoidal of frequency $f_c$. The technique is based on a particular Krylov technique known as the Generalized Conjugate Residual (GCR) algorithm (described in more detail in Yousef Saad, *Iterative Methods for Sparse Linear Systems*, PWS Publishing Company, 1995). However, as will be obvious to one of ordinary skill in the art, any Krylov technique can be adapted to recycle matrix-vector products in a manner analogous to that described below (and in FIG. 12) for GCR.

The technique of FIG. 12 builds up a stored set of matrix-vector products $ap^k$ and vectors $p^k$ for $1 \leq k \leq$ RecycleIndex, which can be reused. In particular, on GCR iteration k for frequency $f_c$, the matrix-vector product $ap^k$ is directly computed as $(I + _cH) p^k$, as described above, if k>RecycleIndex (step 1201). Otherwise, there exists a stored matrix-vector product for GCR iteration k which was previously computed and stored (step 1203) for another frequency (the particular frequency being indicated by the stored variable index[k]). The stored matrix-vector product is reused via equation (12) to produce a new matrix-vector product for iteration k (step 1202). RecycleIndex stores the current number of stored matrix-vector products, and is incremented whenever there is no stored matrix-vector product for the current iteration (step 1201).

In step 1203, the newly computed matrix-vector product and $p^k$ are orthogonalized and the orthogonalized matrix-vector product is stored for the current GCR iteration k (overwriting an existing matrix-vector product for GCR iteration k, if one exists). Also, in step 1203, the current frequency index c is stored (as index[k]) with the stored matrix-vector product in order to permit the correct value of β to be used whenever the stored product is later reused in step 1202 during the kth GCR iteration for another frequency. The operator "H" in the orthogonalization equations of step 1203 represent a Hermetian transpose operation. The residue, r, and the solution x are updated in step 1204.

PSS Analysis Via Finite-Difference Methods

FIGS. 11A–B depict a flowchart 1100 illustrating an alternative technique for obtaining a periodic steady-state solution (PSS) for the circuit of FIG. 1A, in particular, a technique based on a finite-difference method. This PSS technique is described after the above discussion of small signal analysis instead of with the above discussion of a Newton-shooting PSS technique, because of the similarities between the computations performed in the technique of FIG. 11 and those performed during small signal analysis, as described above in reference to FIG. 10.

In step 1101, a backward-Euler technique is used to discretize the system of circuit equations (1) to obtain a non-linear system of difference equations for the PSS solution V at a series of S timepoints $t_0=0, t_1, t_2, \ldots, t_s=T$, where T is the period of the periodic input signal u in FIG. 1A. In step 1102, a Newton iteration is formed to solve the non-linear system of step 1101. In step 1103, for each iteration j of the Newton iteration of step 1102, the following two steps are carried out:

1) solve for $\Delta V_s = V_s^{(j+1)} - V_s^{(j)}$, by applying a matrix-implicit iterative technique to the solution of the following linear system of equations:

$$[I+P_s]\Delta V_s = -L^{-1}[(q(v_s^{(j)})-q(v_{s-1}^{(j)}))/h_s + i(v_s^{(j)}) + u_s]$$

where $P_s$ represents the last N rows of the last N columns of $L^{-1}B$. It will be readily apparent to one skilled in the art that $\Delta V_s$ can be obtained at an approximately O(SN) computational cost using a method analogous to that described above in reference to FIG. 10 for obtaining the small signal response at the last timepoint, i.e., $\hat{v}_s(t_M)$. This follows given the fact that the matrices L and B have essentially the same structure in step 1102 as in step 902 (FIG. 9).

2) given $\Delta V_s$ from step 1, backsolve for the rest of $\Delta V$ via the linear system of step 1102.

Thus, FIG. 11 provides an efficient finite-difference technique for obtaining a PSS solution, having a computational cost that grows approximately in a linear fashion with the number of nodes in the circuit.

Obtaining Quasiperiodic Solutions Via Mixed Frequency-Time Methods

As noted above FIG. 1E depicts another generic circuit 50 of a type frequently analyzed in engineering applications. Circuit 50 is driven by d periodic signals 51, $u_1(t), u_2(t), \ldots u_d(t)$, having unrelated fundamental frequencies $\lambda_1, \lambda_2, \ldots \lambda_d$. Circuit 50 typically has a steady-state response 52, v(t), that is quasiperiodic in d frequencies, i.e., that can be expressed as a linear combination of sinusoids at the sum and difference frequencies from the set consisting of $\lambda_1, \lambda_2, \ldots \lambda_d$ and their harmonics, as given by the following Fourier representation for v(t):

$$v(t) = \sum_{\omega_k \in \Lambda_d} V^C(k)\cos\omega_k t + V^S(k)\sin\omega_k t \qquad (13)$$

where $\Lambda_d = \{\omega : \omega = k_1\lambda_1 + k_2\lambda_2 + \ldots k_d\lambda_d; k_1, k_2, \ldots k_d \text{ are integers}\}$.

Using $\lambda_d$ as a sampling clock frequency, a sequence $\{v(sT): s \text{ is an integer}\}$ is obtained where $T=2\pi/\lambda_d$. The sequence $\{v(sT)\}$ is itself quasiperiodic in d-1 frequencies and is given by the following equation:

$$v(sT) = \sum_{\omega_k \in \Lambda_{d-1}} V^C(k)\cos\omega_k sT + V^S(k)\sin\omega_k sT \qquad (14)$$

where $\Lambda_{d-1} = \{\omega : \omega = k_1\lambda_1 + k_2\lambda_2 + \ldots k_{d-1}\lambda_{d-1}; k_1, k_2, \ldots k_{d-1} \text{ are integers}\}$.

In order to make the analysis of equation (14) computationally tractable, the Fourier coefficients $V^C$ and $V^S$ are assumed to be non-zero for only a finite subset $\Lambda_K$ of $\Lambda_{d-1}$, thereby yielding the following equation for the sequence $\{V(sT)\}$:

$$v(sT) = V(0) + \sum_{k=1}^{K} V^C(k)\cos\omega_k sT + V^S(k)\sin\omega_k sT \qquad (15)$$

where $\Lambda_K = \{\omega_0=0, \omega_1, \omega_2, \ldots \omega_K\}$.

Given the set of J=2K+1 Fourier coefficients (V(0), $V^C(1), V^S(1), \ldots V^C(K), V^S(K)$) of equation (15), the value of v(t) can be computed at any sample time sT. The value of v(t) for any t can be found through transient analysis, starting at the nearest preceding sample time. In order to solve for the J Fourier coefficients, values for v(t) at J sample times must be determined.

FIG. 13 is a flowchart 1300 for a method of computing values for v(t) at J non-adjacent sample times, $\eta_1 T, \eta_2 T, \ldots \eta_J T$, where $\eta_1, \eta_2, \ldots \eta_J$ are integers. In essence, the method of FIG. 13 is based on using J sample values at times $\eta_1 T, \eta_2 T, \ldots \eta_J T$ to determine the immediately following sample values (i.e., at times $(\eta_1+1)T, (\eta_2+1)T, \ldots (\eta_J+1)T$) in two independent ways. When circuit 50 reaches its quasiperiodic steady-state of the form indicated by equation (15), the sample values determined for the times $(\eta_1+1)T, (\eta_2+1)T, \ldots (\eta_J+1)T$ via the two independent ways will be equal, thereby yielding the non-linear system of step 1302.

The first way to determine samples of v(t) at times $(\eta_1+1)T, (\eta_2+1)T, \ldots (\eta_J+1)T$, given samples of v(t) at times $\eta_1 T, \eta_2 T \ldots \eta_J T$ follows from the fact that equation (15) can be used to solve for the J Fourier coefficients (i.e., V(0), $V^C(1), V^S(1), \ldots V^C(K), V^S(K)$) given the J sample values $v(\eta_1 T), v(\eta_2 T), \ldots v(\eta_J T)$. Given the Fourier coefficients, equation (15) can be used to compute the value of any samples, including those at times $(\eta_1+1)T, (\eta_2+1)T, \ldots (\eta_J+T)$. The matrix that needs to be multiplied with the vector of voltages at a circuit node at the times $\eta_1 T, \eta_2 T, \ldots \eta_J T$ in order to obtain the vector of voltages at the node at the following sample times, $(\eta_1+1)T, (\eta_2+1)T, \ldots (\eta_J+1)T$, is given by the J×J delay matrix D(T) of step 1301.

The second way of obtaining sample values at times $(\eta_1+1)T, (\eta_2+1)T, \ldots (\eta_J+1)T$ involves integrating the circuit differential equations (i.e., performing transient analysis) over a time interval of length T using each of the samples at times $\eta_1 T, \eta_2 T, \ldots \eta_J T$ as a starting point, thereby obtaining $\Phi(v(\eta_1 T), \eta_1 T, (\eta_1+1)T), \phi(v(\eta_2 T), \eta_2 T, (\eta_2+1)T), \ldots \phi(v(\eta_J t), \eta_J T, (\eta_J+1)T)$, where $\phi$ is the state transition function.

The samples for the times $(\eta_1+1)T, (\eta_2+1T), \ldots (\eta_j+1)T$ determined via the above two ways are equated to yield the non-linear system of step 1302. This system can be solved using a Newton-iterative method. A direct method solving the respective linear system arising on each Newton iteration via Gaussian elimination has a computational cost that grows with the cube of the number of circuit nodes and is thus impractical for large circuits. However, it will be readily apparent to one skilled in the art that the same matrix-implicit iterative techniques used to solve the linear system of equation (4) can be used to solve the respective linear system arising upon each iteration of a Newton-method solution for the non-linear system of step 1302, thereby resulting in a computational cost for obtaining the quasiperiodic solution that is approximately linear in the number of circuit nodes.

Conclusion

In conclusion, the present invention provides efficient techniques for steady-state and small signal analysis having a computational cost that is approximately linear in the number of circuit nodes. These techniques are, thus, practical for large circuits that cannot be feasibly handled by prior art techniques having a computational cost that grows with the third power of the number of circuit nodes.

The above description is illustrative and not restrictive. For example, the backward-Euler discretization technique used herein could be replaced with higher-order integration methods. In addition, the invention is not limited to the particular Krylov techniques discussed herein, or even to the class of Krylov techniques, but rather could be used with any iterative technique for solving a linear system Ax=b that does not require the value of the matrix A but rather only the value of the product of A with a vector.

Furthermore, the invention is equally applicable to various techniques, other than nodal analysis, for generating systems of differential equations, such as modified nodal analysis, sparse tableau and state equation techniques. The scope of the invention should, therefore, be determined not with reference to the above description, but instead should be determined with reference to the appended claims along with their full scope of equivalents.

What is claimed is:

1. In a circuit simulation tool, a method for determining a periodic steady state response of a circuit driven by a periodic signal, the periodic signal being an input to the circuit, the method comprising the steps of:

producing a first linear system of equations characterizing nodal voltages of said circuit;

producing a second non-linear system of equations based on the first system of equations using a shooting method, the second non-linear system of equations representing initial conditions of the circuit that directly result in the periodic steady state response;

solving the second non-linear system of equations using a Newton iterative method to produce the periodic steady state response of the circuit, including producing for each iteration of the Newton method a corresponding third linear system of equations based on the second non-linear system of equations;

for each iteration of the Newton method, solving its corresponding third linear system of equations using a matrix-implicit iterative technique, including providing a plurality of matrices stored in a memory to contain coefficients relating to the third linear system of equations, each of the matrices having an identical structure, the structure indicating locations of non-zero elements in each of the matrices; wherein data representing the structure is stored in the memory only once, and for each of the matrices, data representing non-zero elements of the matrix are stored in the memory apart from the data representing the structure; and providing the periodic steady state response to the circuit simulation tool.

2. The method of claim 1, wherein the matrix-implicit technique is a Krylov-subspace technique.

3. The method of claim 3, wherein the matrix-implicit technique uses a generalized minimal residual algorithm.

4. The method of claim 3, wherein the matrix-implicit technique uses a generalized conjugate residual algorithm.

5. In a circuit simulation tool, a method for determining a first small-signal quasiperiodic steady state response of a circuit driven by a large periodic signal to a small sinusoid of a first frequency, the first small-signal steady state response covering a plurality of timepoints that span a period of the large periodic signal, the plurality of timepoints including a last timepoint, the method comprising the steps of:

forming a first linear system of equations for the first small-signal steady state response of the circuit at a particular one of the timepoints;

solving the first linear system of equations using a matrix-implicit iterative technique based on a class of Krylov subspace techniques, including producing a first matrix-vector product and storing the first matrix-vector product in a memory;

determining a second small-signal quasiperiodic steady state response of the circuit to a small sinusoid of a second frequency, the second small-signal steady state response covering the plurality of timepoints, the step of determining the second small-signal steady state response comprising the substeps of:

(i) forming a second linear system of equations for the second small-signal steady state response at the particular timepoint;

(ii) solving the second linear system of equations using a Krylov-subspace technique, including producing a second matrix-vector product required by recycling the first matrix-vector product; and providing the first and second small-signal steady state responses to a circuit simulation tool.

6. The method of claim 5, wherein the particular timepoint is the last timepoint.

7. The method of claim 6, wherein the matrix-implicit technique uses a generalized minimal residual algorithm.

8. The method of claim 6, wherein the matrix-implicit technique uses a generalized conjugate residual algorithm.

* * * * *